United States Patent [19]

McCallie

[11] Patent Number: 4,823,115

[45] Date of Patent: Apr. 18, 1989

[54] DETECTION OF LIGHTNING, STORMS AND THE LIKE

[76] Inventor: James A. McCallie, P.O. Box 946, Land o'Lakes, Fla. 34639

[21] Appl. No.: 126,063

[22] Filed: Nov. 27, 1987

[51] Int. Cl.$^4$ ............................................. G01W 1/00
[52] U.S. Cl. ...................................... 340/601; 324/72; 73/170 R
[58] Field of Search ................... 340/601, 602; 324/72, 324/133; 73/170 R

[56] References Cited

U.S. PATENT DOCUMENTS

| | | | |
|---|---|---|---|
| 2,976,522 | 3/1961 | Dowling | 340/601 |
| 3,828,256 | 8/1974 | Liu | 324/72 |
| 4,006,409 | 1/1977 | Adams | 324/133 |

Primary Examiner—Joseph A. Orsino
Assistant Examiner—Jeffery A. Hofsass
Attorney, Agent, or Firm—Charles A. McClure

[57] ABSTRACT

Detection of lightning, storms, or the like via detecting means connected between an external antenna and ground, plus alerting means operatively connected to the detection means. An unpowered cascaded emitter-follower arrangement of at least a Darlington pair triggers a powered alerting circuit via an intervening gate opened when a fluctuation in ambient electric field causes the first transistor in such pair to conduct. A meter indicates such conduction even if the alerting means is not switched on, and alerting indicators in the alerting means may be tested in the absence of any detected field fluctuation.

17 Claims, 1 Drawing Sheet

DETECTION OF LIGHTNING, STORMS AND THE LIKE

FIELD OF THE INVENTION

This invention relates to detection of lightning, storms, or similar electrostatic phenomena, and to alerting observers thereto.

BACKGROUND OF THE INVENTION

Lightning, storms, and similar electrostatic phenomena have been objects of attention since time immemorial, and devices for alerting observers thereto are numerous and well known. Examples include the "Thunderstorm Warning System" of Lundquist & Scuka U.S. Pat. No. 3,611,365; the "Severe Weather Warning Device" of Downing & McEwen U.S. Pat. No. 3,753,117; and the "Stormscope" of Ryan & Spitzer U.S. Pat No. 4,023,408. However, such devices require lines or batteries to sense such phenomena as well as to actuate their many and varied components. Moreover, their reception and indication of lightning, etc. utilize radio frequencies and, thus, are subject to RF interference from identifiable and unidentifiable sources, both local and distant. These complications are confusing to observers and undesirable, so my detection devices and methods avoid them.

SUMMARY OF THE INVENTION

In general, the present invention provides means and methods for detecting lightning, storms, and similar electrostatic phenomena with the aid of an exterior antenna and a grounding wire, rod, etc. In particular, sensing apparatus responsive to fluctuating ambient electric field strength is input-connected between the antenna and ground, and is output-connected to alerting means actuated thereby.

A primary object of this invention is to provide apparatus and methods to detect such electrostatic phenomena without requiring an added power source for such detection.

Another object of the invention is to alert nearby observers by audible and/or visible indications of such phenomena without necessity for them to give such apparatus close attention.

A further object of this invention is to vary such alerting indications in accordance with the distance and/or strength of the detected lightning, etc.

Other objects of the present invention, together with means and methods for attaining the various objects, will be apparent from the accompanying diagrams and the following description of a preferred embodiment thereof, presented by way of example rather than limitation.

DETAILED DESCRIPTION

Figure 1:
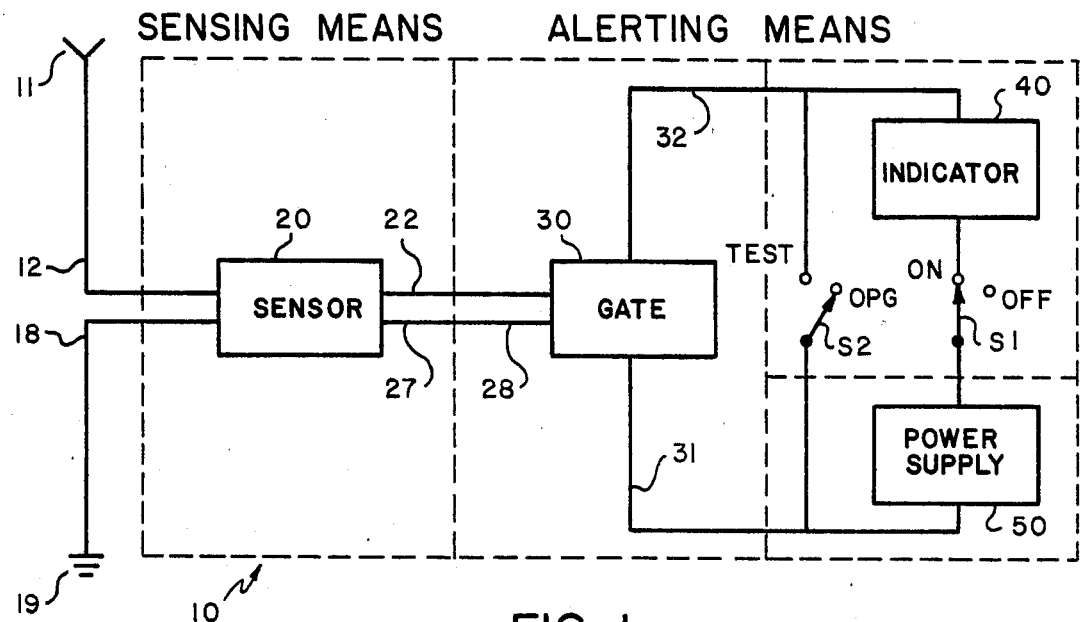
FIG. 1 is a block diagram of apparatus useful according to this invention.

FIG. 1 represents apparatus 10 of this invention, largely in block form. Indicated at the upper left is antenna 11 with lead 12 down from it, and at the lower left earth ground 19 with lead 18 down to it. Otherwise, this diagram is divided into two main rectangles (broken lines) marked SENSING MEANS (at the left) with a single block therein and ALERTING MEANS (at the right) containing several blocks. Single SENSOR block 20 receives lead pair 12, 18 at the left, and at the right it connects Via pair of leads 22, 28 to first or GATE block 80 of the ALERTING MEANS. Leads 32 and 31 therefrom join the GATE block to INDICATOR block 40 and to POWER SUPPLY block 50, respectively. ON/OFF switch S1 is between the latter two blocks, and BAT TEST switch S2 is between the GATE block and the POWER SUPPLY block.

Figure 2:
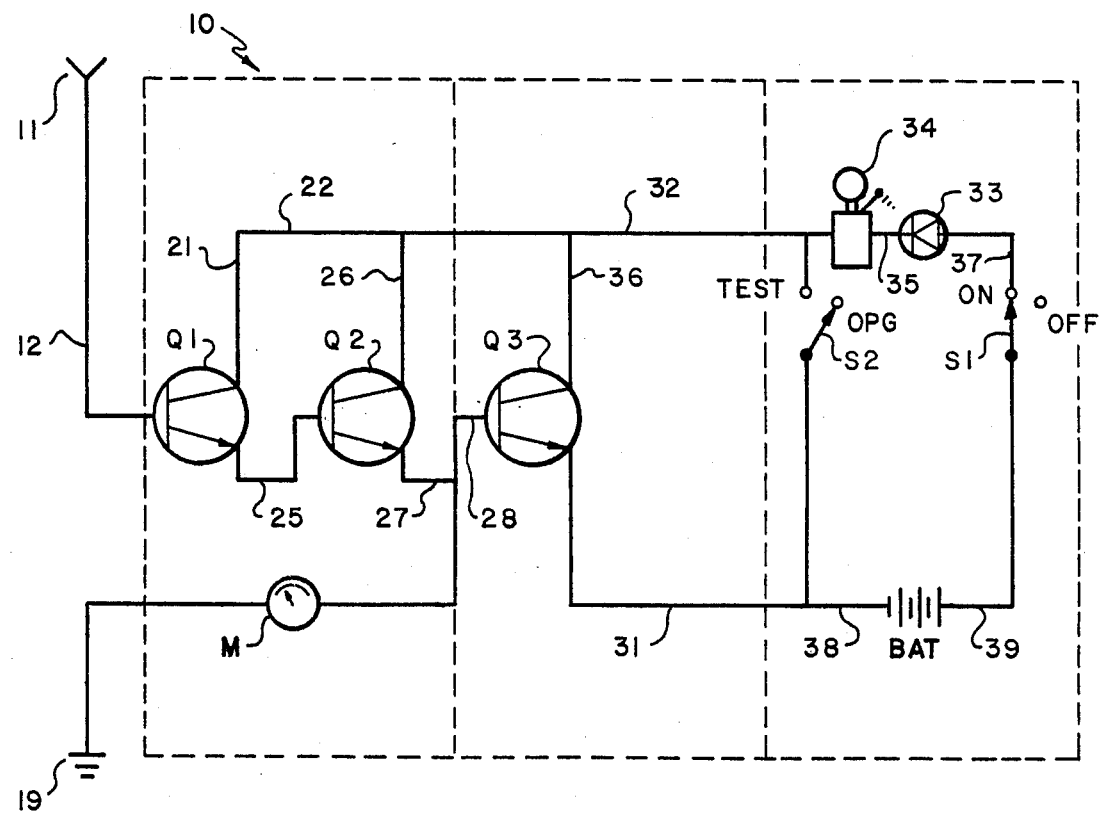
FIG. 2 is a circuit diagram of certain electrical circuitry of such apparatus.

FIG. 2 illustrates such apparatus 10 schematically with more emphasis upon electrical circuitry within the blocks of FIG. 1. Though still outlined in broken lines the blocks are not separately identified in this view. A cascaded emitter-follower arrangement is featured, wherein Q1 and Q2 form a Darlington pair, with the Q1 emitter connected to the Q2 base by lead 25, and their respective collectors connected together via leads 21 and 26 to common lead 22. Similarly, the emitter of Q2 is connected by lead 27 to base lead 28 of gate transistor Q8. Lead 12 from the antenna connects to the base of Q1, whereas lead 18 from ground connects to the emitter of Q2 and optionally contains micor-ammeter M, which itself is independent of the alerting means power supply.

The Q3 collector lead 36 is connected to common collector lead 22 which joins lead 32 to audible indicator 34—which is connected in turn to visible indicator 33 by lead 35. The audible indicator is shown in buzzer form, while the visible indicator is shown as a light-emitting diode (LED). The Q3 emitter lead 31 connects to lead 38 (negative) of BAT, a battery to power the indicators in the ON position of switch S1, which is interposed between lead 37 from the LED and BAT lead 39 (positive). The indicators are inactive when S1 is OFF. Switch S2 (normally in its open or OPG position) when manually pressed momentarily to its TEST or closed position connects the audible indicator lead 32 to the junction of Q3 emitter lead 31 and BAT lead 38, as is useful in checking the condition of the battery and the indicators.

The operation of the described and illustrated preferred apparatus embodiment of this invention is readily understood. The antenna is strung horizontally above the ground at a height of a couple meters, for example, and a grounding rod is driven into the earth, preferably in the vicinity, so that a lead pair can connect the described apparatus to both antenna and ground.

Upon a change in the ambient electrostatic field, usually evidence of lightning, storm, or similar phenomenon near or far from the installation, the base of the first transistor in the Darlington pair is biased (sometimes called "hole-biased") by the inrush of positive charges (or "holes") from the antenna. This enables conduction, as the very large input impedance of Q1 is reduced by such biasing, whereupon a small current flows through it. By reason of the emitter-follower connection of Q1 and Q2, the resulting rush of current (both such "holes" and the initial slight flow between the collector and the emitter of Q1) goes to the Q2 base and biases it more than Q1 was, whereupon a greater (amplified) conduction occurs through Q2 and to ground. Such current flow could be observed on millivolt meter M even in the absence of the alerting means and its power supply but, of course, would require an observer's close attention in doing so.

At Q3, the progressive lowering of resistance causes base current to flow therein, greatly lowering the internal resistance thereof. This enables or "gates" large current flow between the Q3 collector and emitter from the battery and, thus, through the indicators in series with it. Such flow actuates the indicators to alert persons nearby to hear the sound and/or see the light of the audible and/or visible indicators.

In practice, with such apparatus switched to ON, a distant lightning discharge momentarily actuates the audible indicator to tick and the LED to blink. As the lightning gets closer, the ticks get louder until the lightning is close enough to fully actuate the buzzer and cause the light (LED) to flash brightly for each lightning discharge.

A weak change in electrostatic field causes the transistors to conduct briefly, which enables the buzzer to tick and the light to blink dimly. A greater field strength fluctuation allows the transistors to conduct enough to fully actuate both the buzzer and the light. Practicality is more important than theory here, but it appears that such electric field changes or fluctuations are propagated wavelike along and through the surface of the earth, with very long wavelengths and correspondingly low frequencies, such as up from 0 Hz to about 4 kHz (more than 25 miles in length). They can be sensed by the illustrated embodiment of this invention from as far as 20 to 50 miles or so.

Other electrostatic field phenomena subject to sensing by such apparatus and method include both the formation and the dissipation of meteorological charge carriers, such as rain, fog, and even dew. Physical contact of rain against the antenna may cause continuous actuation, as may surges of cold (positively charged) air from the upper reaches of a thunderstorm—perhaps associated with a general weakening of the storm activity.

The components of apparatus for practicing the method of this invention are all readily available. A single integrated chip, ECG 172A, provides the Darlington pair (Q1 and Q2), while the gate transistor (Q3) is a 2N2222. A 9-volt dry battery is used to actuate suitable indicators, and their ON/OFF switch is conveniently a toggle switch, whereas the BAT TEST switch is a push-button biased to the open position. Selection of other, equivalent components is well within the capability of persons ordinarily skilled in such rudimentary electronic art, with the present specification as a guide to the desired objectives.

Advantages and benefits of this invention are apparent. No power source is needed to actuate the detection or sensing means for a close observer. A not-too-attentive observer has the added convenience of being alerted by a loud or bright attention-getting indication. Moreover, RF interference is not a problem as it is in conventional equipment reactive to such emanation from storms, lightning, etc.

It will be apparent that for greater sensitivity, one can extend the cascaded emitter-follower arrangement by one or more stages, such as by so connecting another Darlington pair after the first one. Other desired variations may be made in either the inventive apparatus or method, as by adding, combining, or subdividing parts or steps, while retaining at least some of the advantages and benefits of the present invention—which itself is defined in the following claims.

The claimed invention:

1. In apparatus adapted to detect lightning, storms, or like electrostatic phenomena via an exterior antenna and a ground wire, the improvement comprising
    unpowered bipolar junction sensing means
        connected between the antenna and ground, and responsive to fluctuating ambient electric field strength;
    and alerting means actuated by such sensing means.

2. Detection apparatus according to claim 1, including a milli-ammeter.

3. Detection apparatus according to claim 1, wherein the alerting means includes
    indicator means, and
    gate means interposed between the sensing means and the indicator means.

4. Detection apparatus according to claim 3, wherein the alerting means includes also an electric power source,
    and the indicator means includes one or more audible or visible indicators powered by such power source.

5. Detection apparatus according to claim 1, wherein the sensing means includes a plurality of bipolar transistors in a cascaded emitter-follower arrangement.

6. Detection apparatus according to claim 5, wherein the
    first transistor therein has its base connected to the antenna, and its emitter connected to ground; and including also
    a gate transistor with its base connected to the emitter of an intervening transistor in such arrangement, and with its emitter and collector connected across indicator means in series with a battery powering such indicator means.

7. Detection arrangement according to claim 5, wherein such indicator means includes both audible and visible indicators.

8. In apparatus including both an exterior antenna and a ground connection, for detecting fluctuating electric fields propagated by lightning, storms, or like electrostatic phenomena the combination of
    an arrangement of bipolar transistors including an unpowered Darlington pair,
    with the base of the first transistor in such pair connected to the antenna, and
    with the emitter of such transistor connected to ground;
    being thereby conductive when such first transistor senses such a fluctuation in ambient electric field strength.

9. Detection apparatus according to claim 8, wherein the detected fluctuations have a frequency of at most about 4 kHz. and the range of detection is upwards of 50 miles.

10. Detection apparatus according to claim 8, including
    a gate transistor arranged to conduct whenever such first transistor conducts, and
    indicator means and a power source connected in series so as to actuate the indicator means whenever such gate transistor conduction closes such series circuit.

11. Detection apparatus according to claim 10, including an on/off switch in such series circuit and adapted to open such circuit and thereby inactivate such indicator means in the off position.

12. Detection apparatus according to claim 10, including an operating/test switch paralleling such gate transistor and adapted to close such circuit in the test position even though such transistor is not conducting.

13. In a method for detecting fluctuating electric fields propagated by lightning, storms, or like electrostatic phenomena, including using both an exterior antenna and a ground connection, the steps of arranging a plurality of bipolar transistors in an unpowered emitter-follower arrangement, with the base of the first such transistor connected to the antenna, and with the emitter of such transistor connected to ground;

whereby conduction occurs in such arrangement when such first transistor senses such a fluctuation in ambient electric field strength.

14. Detection method according to claim 13, including connecting an electrical power supply and indicating means between the emitter and collector of the last transistor in such arrangement, and thereby actuating such indicating means when such conduction occurs.

15. Electronic lightning-detection apparatus comprising unpowered bipolar transistor means adapted to sense lightning as far away as about 20 to 50 miles, and powered indicator means triggerable by the transistor means and adapted to indicate the distance of sensed lightning audibly or visually, or both, by an observable characteristic of such indications.

16. Lightning-detection method utilizing apparatus according to claim 15, wherein the observable indication is greater in intensity, the closer the lightning, including the step of observing such intensity and interpreting it as an indicator of the closeness of the lightning.

17. Lightning-detection method utilizing apparatus according to claim 15, wherein the observable indication is longer in duration, the closer the lightning, including observing such duration and interpreting it as an indicator of the closeness of the lightning.

* * * * *